United States Patent
Nishii et al.

(12) 
(10) Patent No.: US 7,097,394 B2
(45) Date of Patent: Aug. 29, 2006

(54) CIRCUIT BOARD PRODUCTION METHOD AND CIRCUIT BOARD PRODUCTION DATA

(75) Inventors: Toshihiro Nishii, Osaka (JP); Hiroshi Yamaji, Mie (JP); Tadao Kimura, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 427 days.

(21) Appl. No.: 10/149,202

(22) PCT Filed: Oct. 10, 2001

(86) PCT No.: PCT/JP01/08905

§ 371 (c)(1),
(2), (4) Date: Sep. 10, 2002

(87) PCT Pub. No.: WO02/30636

PCT Pub. Date: Apr. 18, 2002

(65) Prior Publication Data

US 2003/0044248 A1    Mar. 6, 2003

(30) Foreign Application Priority Data

Oct. 11, 2000    (JP)    .............................. 2000-310419

(51) Int. Cl.
B23B 35/00    (2006.01)

(52) U.S. Cl. ................. 408/1 R; 219/121.71; 700/121; 408/3; 408/704

(58) Field of Classification Search ................ 408/1 R, 408/3, 13, 16, 704; 700/166, 90, 117, 121; 219/121.7, 121.71, 121.18
See application file for complete search history.

(56) References Cited

U.S. PATENT DOCUMENTS

| | | | | |
|---|---|---|---|---|
| 5,111,406 A | * | 5/1992 | Zachman et al. | ........... 700/160 |
| 5,529,441 A | * | 6/1996 | Kosmowski et al. | ....... 408/1 R |
| 5,533,841 A | | 7/1996 | Iwano et al. | |
| 5,593,606 A | * | 1/1997 | Owen et al. | ........... 219/121.71 |
| 5,614,114 A | * | 3/1997 | Owen | ..................... 219/121.66 |
| 5,933,218 A | * | 8/1999 | Matsubara et al. | ............ 355/67 |
| 6,030,154 A | * | 2/2000 | Whitcomb et al. | ......... 408/1 R |
| 6,407,363 B1 | * | 6/2002 | Dunsky et al. | ........ 219/121.71 |
| 6,615,099 B1 | * | 9/2003 | Muller et al. | ................ 700/166 |

FOREIGN PATENT DOCUMENTS

| | | | |
|---|---|---|---|
| EP | 642861 A1 | * | 3/1995 |
| JP | 02185307 A | * | 7/1990 |
| JP | 04193410 A | * | 7/1992 |
| JP | 04-288202 A | | 10/1992 |

(Continued)

*Primary Examiner*—Daniel W. Howell
(74) *Attorney, Agent, or Firm*—Wenderoth, Lind & Ponack, L.L.P.

(57) ABSTRACT

In the process of forming a through-hole or blind-hole at desired positions of a the substrate material, the present invention sets a drilling target position for each hole and a plurality of auxiliary drilling positions at a periphery of the drilling target position, and performs a plurality of drillings at the drilling target position and the plurality of auxiliary drilling positions. In another preferred embodiment of the present invention, a plurality of drillings are performed only at the auxiliary drilling positions per one hole at the desired position. According to the present invention, through-holes or blind-holes having several sizes of diameters can be formed by using one drilling jig under a single drilling condition. Accordingly, it is possible to efficiently produce circuit boards at low costs.

20 Claims, 4 Drawing Sheets

| | FOREIGN PATENT DOCUMENTS | | |
|---|---|---|---|
| JP | 04352487 A * | 12/1992 | |
| JP | 05-008198 A | 1/1993 | |
| JP | 05096413 A * | 4/1993 | |
| JP | 05154799 A * | 6/1993 | |
| JP | 07241731 A * | 9/1995 | |
| JP | 09085693 A * | 3/1997 | |
| JP | 09307212 A * | 11/1997 | |
| JP | 10-337699 A | 12/1998 | |
| JP | 11-010593 A | 1/1999 | |
| JP | 11121900 A * | 4/1999 | |
| JP | 11-165299 A | 6/1999 | |
| JP | 11-277261 A | 10/1999 | |
| JP | 2000218416 A * | 8/2000 | |
| JP | 2002009451 A * | 1/2002 | |
| JP | 2003-71794 A * | 3/2003 | |

\* cited by examiner

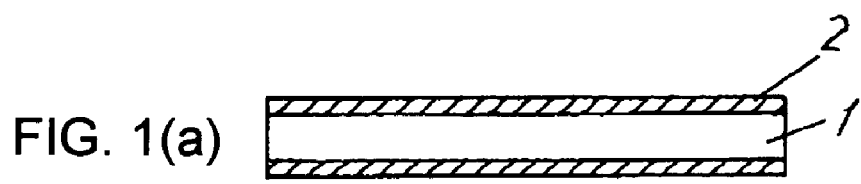
FIG. 1(a)
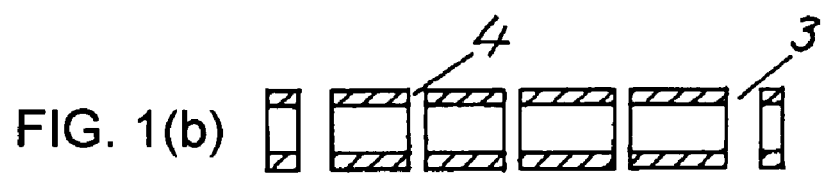
FIG. 1(b)
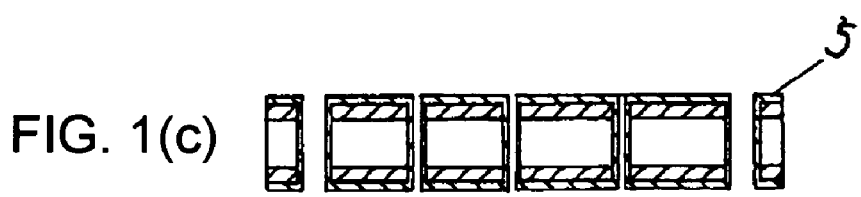
FIG. 1(c)
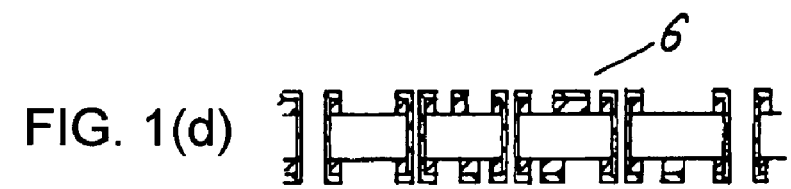
FIG. 1(d)
FIG. 2
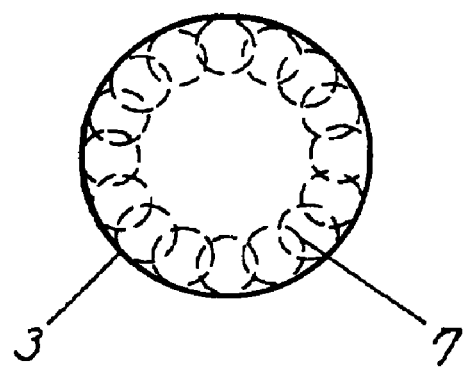

FIG. 4A
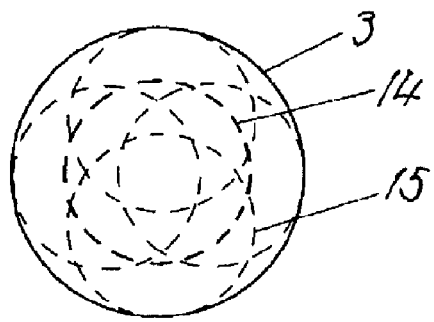
FIG. 4B
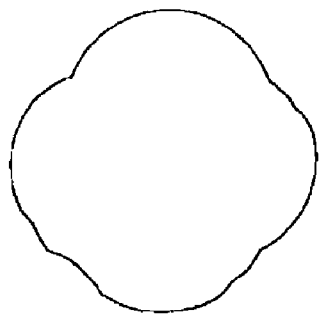
FIG. 5A
T15
X1345Y-149103
X17000Y-151104
X1870Y-151104
T20
X189300Y-15075
FIG. 5B
T15
X1345Y-149103
X17000Y-151104
X1870Y-151104
X189300Y-15075
X189325Y-15075
X189275Y-15075
X189300Y-15050
X189300Y-15100

CIRCUIT BOARD PRODUCTION METHOD AND CIRCUIT BOARD PRODUCTION DATA

TECHNICAL FIELD

The present invention relates to a method of manufacturing a circuit board and data used for manufacturing the circuit board.

BACKGROUND ART

With a recent trend of reduction in size and an increase in density of electronic equipment, double-sided circuit boards or multi-layered circuit boards are increasingly employed in place of conventional single-sided circuit boards in the field of circuit boards on which electronic components are mounted. Also, high-density circuit boards capable of mounting as many circuits as possible thereon are being developed.

As for the high-density circuit boards, design rules for circuits are becoming stringent and are requiring finer processing techniques for forming the circuits as compared with the conventional circuit boards. Regarding the multi-layered circuit boards, progress is continuously made for the development of interstitial circuit connection, through-hole and via-hole positioning techniques, and fine-pitch interstitial connection techniques.

However, as the design rules for circuits are becoming increasingly stringent, the sizes of circuit patterns, diameters of through-holes or via-holes in circuit boards, and the values of allowable applied current are becoming increasingly smaller.

In the case of an ordinary electronic circuit, the values of current flowing in each component in the circuit vary and, for example, large current values are required for power supply circuits. Although the value of current flowing in a signal circuit or the like is very small, the design rule for the circuit is required to be finer because of circuit complications and requirements for a reduction in size of electronic equipment.

Thus, in the present circuit boards, it is required to form circuit patterns through-holes or via-holes ranging from a large size to a small size in one sheet of a circuit board.

In an ordinary circuit board, a paste printing method or a photolithography method is employed for forming circuit patterns. Accordingly, it is not too difficult to form circuit patterns ranging from a large size to a small size together.

However, in forming through-holes or via-holes which have different diameters, it is necessary to use a drilling machine having multiple axes in which drills of different diameters can be used during a drilling operation. Also, in the case of drilling by using a laser beam, it is necessary to adopt a plurality of machining conditions for each of the diameters or to control the diameters by spiral scanning of the laser beam. Further, in a case of a laser process using an image transfer method, it is necessary to use a plurality of masks having a plurality of diameters, and the machine configuration becomes complicated, thereby preventing high speed machining and increasing the cost of manufacturing.

Also, data by which the finishing coordinate position in the substrate is indicated to the drilling machine is usually called NC data which is stored in paper tape, electronic medium or the like. The data becomes complicated and increased in quantity when the sizes of diameters increase, thereby requiring much more time for preparation of the data.

In the production of circuit boards, a plurality of circuit boards are arranged within a standard work size, and a tool pattern used in the manufacturing process is located at the periphery of the work size. The tool pattern includes test patterns for monitoring the board characteristics and guide marks for positioning the board in the manufacturing process.

Also, positioning marks and the like for mounting electronic components on the circuit board are often formed on the circuit boards.

However, although it is not necessary to miniaturize such guide marks at the same level as for higher-density circuit boards, it is convenient for the marks to have a specific size appropriate for their recognition.

For example, when via-holes for interstitial connection are formed in the substrate material by using a laser beam, currently available techniques are able to manufacture holes having minimum diameters ranging from 80 to 50 µm for extra-high-density circuit boards. However, if guide marks or the like are formed in such diameters, it is difficult to recognize the mark positions and, therefore, guide marks or the like are usually formed in diameters of 200 µm or more. To achieve the purpose, an exclusive machine and machining system for forming fine holes are employed to make holes with large diameters for guide marks, causing losses with respect to the time and cost.

In a high-density circuit board, it is necessary to make hundreds of thousands of fine holes per square meter and, thus, tens of thousands to hundreds of thousands of holes for via-holes are formed per sheet of a work size.

On the other hand, only about several tens of holes per sheet of a work size are formed for guide marks. Thus, there arises a problem of a decrease in a drilling efficiency because of the operation required for making a small number of guide mark holes having large diameters.

In order to address such a problem, the present invention is intended to provide a method of manufacturing a circuit board and manufacturing data by which both fine holes and large holes can be efficiently formed by using one drilling system.

SUMMARY OF THE INVENTION

The present invention comprises, in the process of forming a through-hole or blind-hole located at least in one desired position of the substrate, setting a drilling target position for each hole at the desired position and a plurality of auxiliary drilling positions at the periphery of the drilling target position, and forming a plurality of holes at the drilling target position and the plurality of auxiliary drilling positions. Also, in another preferred embodiment of the present invention, the present invention comprises forming a plurality of holes only at the auxiliary drilling positions per one hole at a desired position.

According to the present invention, it is possible to make through-holes or blind-holes having several sizes of different diameters by using one drilling jig and a single drilling condition. That is, relatively large holes can be formed by only using a special machine for fine drilling, and circuit boards can be efficiently manufactured at low costs.

BRIEF DESCRIPTION OF THE DRAWINGS

FIG. 1 (*a*) is a first sectional view showing a circuit board manufacturing method in a first preferred embodiment of the present invention.

FIG. 1 (b) is a second sectional view showing the circuit board manufacturing method in the first preferred embodiment of the present invention.

FIG. 1 (c) is a third sectional view showing the circuit board manufacturing method in the first preferred embodiment of the present invention.

FIG. 1 (d) is a fourth sectional view showing the circuit board manufacturing method in the first preferred embodiment of the present invention.

FIG. 2 is a top view owing a drilling method of the circuit board manufacturing method in the first preferred embodiment of the present invention.

FIG. 3 (b) is a second sectional view showing the circuit board manufacturing method in the second preferred embodiment of the present invention.

FIG. 3 (c) is a third sectional view showing the circuit board manufacturing method in the second preferred embodiment of the present invention.

FIG. 3 (d) is a fourth sectional view showing the circuit board manufacturing method in the second preferred embodiment of the present invention.

FIG. 3 (e) is a fifth sectional view showing the circuit board manufacturing method in the second preferred embodiment of the present invention.

FIG. 3 (f) is a sixth sectional view showing the circuit board manufacturing method in the second preferred embodiment of the present invention.

FIG. 3 (g) is a seventh sectional view showing the circuit board manufacturing method in the second preferred embodiment of the present invention.

FIG. 3 (h) is a eighth sectional view showing the circuit board manufacturing method in the second preferred embodiment of the present invention.

FIG. 3 (i) is a ninth sectional view showing the circuit board manufacturing method in the second preferred embodiment of the present invention.

FIG. 4A is a top view showing a circuit board drilling position in the second preferred embodiment of the present invention.

FIG. 4B is a top view after drilling at the drilling position in the second preferred embodiment of the present invention.

FIG. 5A is an example of conventional circuit board manufacturing data.

FIG. 5B is an example of circuit board manufacturing data in the third preferred embodiment of the present invention.

DETAILED DESCRIPTION OF THE INVENTION

Figure 3A:
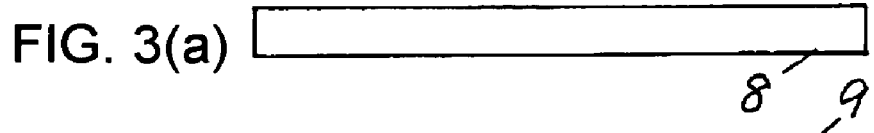
FIG. 3 (a) is a first sectional view showing a circuit board manufacturing method in a second preferred embodiment of the present invention.
Figure 3B:
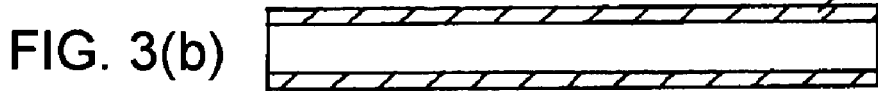
Figure 3C:
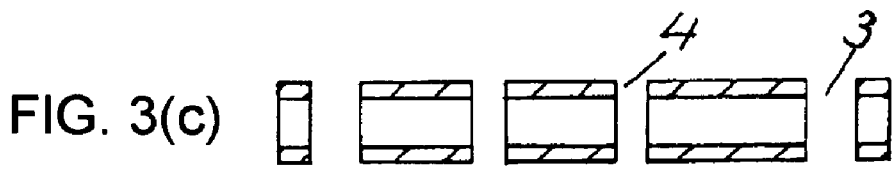
Figure 3D:
Figure 3E:
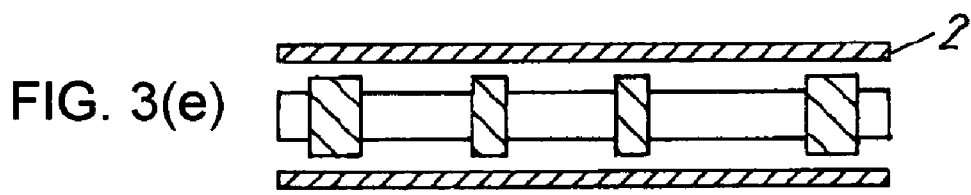
Figure 3F:
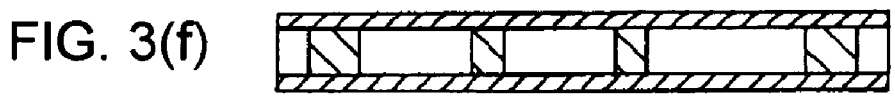
Figure 3G:
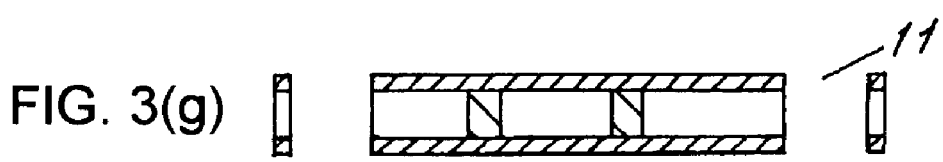
Figure 3H:
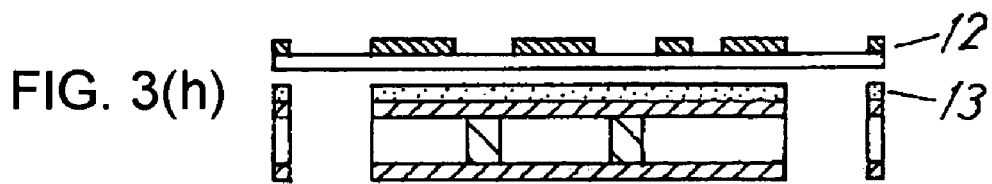
Figure 3I:
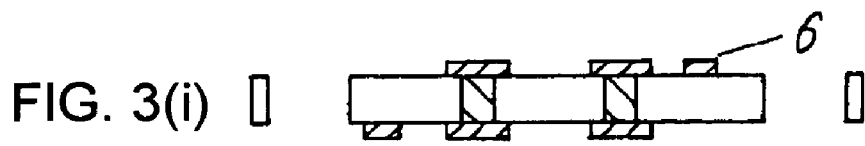

The preferred embodiments of the present invention will be described in the following with reference to FIG. 1 to FIG. 6.

First Preferred Embodiment

FIG. 1 is a sectional view showing a circuit board manufacturing method in the first preferred embodiment of the present invention.

As shown in FIG. 1 (a), the surface of substrate material 1 is adhered with copper foil 2 to form a copper-clad laminate. To form the substrate material 1, after impregnating a woven or non-woven fabric such as a glass fiber fabric with thermosetting resin such as an epoxy resin or the like, the resin is half-cured to a B stage to become prepreg. Copper foil 2 is disposed on both sides of the substrate material 1, and after integral molding by heat pressing using a hot press, it is cut to the desired size to obtain a copper-clad-laminate.

In the present preferred embodiment, the thickness of the copper-clad-laminate is 0.6 mm, and the thickness of the copper foil 2 is 18 μm.

As shown in FIG. 1(b), a positioning through-hole 3 and a through-hole 4 are formed in the copper-clad-laminate.

A drilling method is used for forming holes. A diameter of the positioning through-hole 3 is about 1 mm, and a diameter of the through-hole 4 is 0.2 mm.

As shown in FIG. 1 (c), a copper plated layer 5, which is about 18 μm in thickness, is plated on the surface of the copper-clad-laminate by electroless copper plating and electrolytic copper plating.

Subsequently, as shown in FIG. 1 (d), a circuit 6 is formed by patterning using photolithography to provide a double-sided circuit board.

For positioning of the exposure mask for patterning, the positioning through-hole 3 is recognized by a CCD camera, and coordinates of a center are obtained by image processing.

In the circuit board manufacturing process described in the present preferred embodiment, when the positioning through-hole 3 is different in diameter from the through-hole 4, the method conventionally employed was to use drills of different diameters. Therefore, the drilling speed became slower as compared to the case of continuous drilling to form holes of a same diameter. On the other hand, in the present preferred embodiment, there is no decrease in the drilling speed since a laser beam of same diameter is used for drilling.

FIG. 2 is a top view showing a drilling method in the circuit board manufacturing method in the present preferred embodiment, and the positioning through-hole 3 is shown by a solid line. Also, sixteen auxiliary holes 7 inside the through-hole 3 are shown by dotted lines.

A diameter of the auxiliary hole 7 is 0.2 mm which is the same as the diameter of the through-hole 4. In this preferred embodiment, the positioning through-hole 3 is not formed by using a drill of 1 mm in diameter, but a drill of 0.2 mm in diameter is used which is the same diameter used for forming the through-hole 4, and a through-hole of 1 mm in diameter is obtained by performing drilling 16 times along the inner periphery of the 1 mm diameter of the positioning through-hole 3.

In the case of higher-density circuit boards, the exposure mark aligning accuracy is important for patterning with respect to the through-hole 4. In the present preferred embodiment, the positioning through-hole 3 can be formed by using a same machining head as used for the through-hole 4, and it is possible to form both holes with excellent reproducibility of their relative positions.

Further, since only one size of a drill having a 0.2 mm diameter is used, there is no time loss caused due to a changing of the machining head, and coordinate data only expressing simple coordinate positions can be adopted for the drilling operation.

Also, in the drilling method in the preferred embodiment, the positioning through-hole 3 has a slightly deformed shape, but when recognizing the positioning through-hole 3 using an exposure device for patterning or the like, the center of a gravity position of the image of the positioning through-hole 3 is recognized as the center of the hole, and therefore, the peripheral deformed shape will not affect the drilling accuracy.

Also, in the present preferred embodiment, the positioning through-holes 3 are formed by executing drilling 16 times, but it is possible to decrease the number of drilling times taking into account the difference in diameter between the auxiliary hole 7 and the positioning through-hole 3, and the margin or the like for equipment in the manufacturing process with respect to the deformed shape of the hole.

Second Preferred Embodiment

FIG. 3 is a sectional view showing the circuit board manufacturing method in the second preferred embodiment of the present invention.

The substrate material 8 shown in FIG. 3 (*a*) is a prepreg, the same as in the first preferred embodiment. In this preferred embodiment, a non-woven fabric made of an aramid fiber is used as reinforcing material.

As shown in FIG. 3 (*b*), a film 9 is laminated on both sides of the substrate material 8 by using a hot roll (not shown) or the like. Subsequently, as shown in FIG. 3(*c*), a positioning through-hole 3 and a through-hole 4 are formed. In the present preferred embodiment, a positioning a through-hole 3 of 200 µm in diameter and a through-hole 4 of 130 µm in diameter are formed using a carbon dioxide gas laser.

Next, after filling conductive paste 10 into the positioning through-hole 3 and the through-hole 4 by a printing process, the film 9 is peeled off to form a substrate material 8 with conductive paste 10 filled as shown in FIG. 3 (*d*). In the printing process, the film 9 serves as a mask in printing conductive paste 10.

Further, as shown FIG. 3 (*e*), a copper foil 2 is disposed on both sides of substrate material 8 and is heat pressed by a hot press (not shown) as shown in FIG. 3 (*f*). In this way, the copper foil 2 is molded into one-piece with the substrate material 8 and, at the same time, back and surface copper foils 2 are electrically connected to each other by the conductive paste 10.

As shown in FIG. 3 (*g*), a positioning guide hole 11 is formed by a drill using the positioning through-hole 3 as a target. Since both sides of the substrate material 8 are covered with copper foil 2 and the positioning through-hole 3 cannot be observed, the positioning guide hole is recognized by observing the conductive paste 10 filled in the positioning through-hole 3 by an X-ray radioscopy device.

In the experiment performed by the inventors, the diameter of the positioning through-hole 3 had to be at least 200 µm in diameter for the observation of the guide hole using the X-ray radioscopy device.

When the diameter of the guide hole is less than 150 µm, the image was not clear enough to observe and it was difficult to accurately set the positioning guide hole 11 at the target position. However, it is noted that this is dependent upon the thickness of the substrate material 8 and the copper foil 2.

On the other hand, as for the diameter of the through-hole 4, the diameter adopted is about 130 µm because the surface and back copper foils have good electrical connection with each other when the diameter is from 100 to 150 µm.

Next, as shown in FIG. 3 (*h*), a photosensitive resist 13 was formed on the surface of the substrate material 8, a photo mask 12 was aligned using the positioning guide hole 11 as a reference, and the resist 13 was exposed to an ultraviolet ray radiated from above. The photo mask 12 and the resist 13 are shown only at an upper side of the substrate material 8, but the bottom side is also processed the same as the upper side.

Next, through a developing process and an etching process (not shown), a patterning of the copper foil 2 was performed to obtained a double-sided circuit board with a circuit 6 formed thereon as shown in FIG. 3 (*i*).

A method of forming the positioning through-hole 3 in the present preferred embodiment is shown in FIG. 4A. FIG. 4A is a top view of the drilling position. A shape necessary for positioning the through-hole 3 and a relation between a drilling target position 14 and an auxiliary drilling position 15 are shown in FIG. 4A.

The positioning through-hole 3 is a round hole of 200 µm in diameter, and the drilling target position 14 is located at the center thereof. However, the five holes in total at the drilling target position 14 and the auxiliary drilling position 15 are respectively about 130 µm in diameter as shown because they are formed under the same machining conditions as those for through-hole 4.

The method is designed so that the outer periphery of the auxiliary drilling position 15 comes in contact with the outer periphery of the positioning through-hole 3, and the center of each auxiliary drilling position 15 is shifted about 35 µm from the center of the drilling target position 14.

A shape of a hole obtained by irradiating above-mentioned five holes with a carbon dioxide laser is shown in FIG. 4B.

The shape of the hole is slightly deformed, but the positioning through-hole 3 obtained is about 200 µm in size, and such slight deformation will cause no bad influences to the post-process because of the same reason as mention in the preferred embodiment 1.

The result of study by the inventors shows that, by taking the specifications of diameter, X-ray or CCD camera and other image recognizing devices used in the circuit board manufacturing process into account, it is effective to make the distance between the auxiliary drilling positions and the drilling target position, that is, the amount of the shift between the centers, to be 75 µm or less, and more preferable to be 50 µm or less.

Also, in order make the hole preferable in shape or formed so as not to affect the accuracy of recognition and the like in the post-process, it is effective to make a distance between the auxiliary drilling position 15 and the drilling target position 14 to be nearly half or less, and more preferably to be ¼ or less, of the diameter of the hole obtained by one drilling. That is, in the present preferred embodiment, it is preferable to make the diameter nearly half or less, and more preferably to be ¼ or less of the diameter of the through-hole 4 and the value described above.

When the amount of the shift is beyond the above-described range, the shape of the hole obtained is greatly deformed, and in this preferred embodiment, it may cause unstable filling of conductive paste, variation in accuracy of recognition by X-ray, or remarkable influences given to the hole shape due to the variation in the hole position accuracy of the laser processing machine.

In the present preferred embodiment, an auxiliary drilling position 15 is formed at four positions, but better results may be obtained by forming more holes for the purpose of improving the hole shape.

To perform the drilling operation efficiently, there is a method in which the holes are formed at two points shifted 35 µm to the right and left from the center of drilling target position 14, and the method can form a hole of 200 µm in size by performing two drillings. However, the hole obtained is generally oval in shape as a matter of course. Also, when higher recognition accuracy is required in the post-process, for instance, it is more preferable to employ a method of forming three holes at three apices of an equilateral triangle with the drilling target position 14 at a center or forming four holes as described in the present embodiment.

Third Preferred Embodiment

FIG. 5 shows a part of data for manufacturing a circuit board in the third preferred embodiment of the present invention.

FIG. 5A is conventional drilling data showing an example of forming one positioning through-hole of 200 μm in diameter (shown by T20 data) after forming three through-holes of 150 μm in diameter (shown by T15 data).

On the other hand, FIG. 5B shows data for changing a hole diameter by performing only 150 μm diameter drilling in the third preferred embodiment of the present invention. As for the positioning through-hole machining method, the amount of shift is 25 μm which is the same as in the second preferred embodiment.

When data of the present embodiment is used, it is very easy to process the data since all the machining coordinates may be processed under a single machining condition in the drilling machine which receives the data.

In FIG. 5B, T15 that shows a hole diameter of 150 μm is also recited, but, for the case where all the diameters in the data are 150 μm, it is possible not to recite T15.

Thus, in the configuration of the present preferred embodiment, the diameter indication can be simplified, and a preparation and an operation of the circuit board manufacturing data can be simplified.

Fourth Preferred Embodiment

Figure 6:
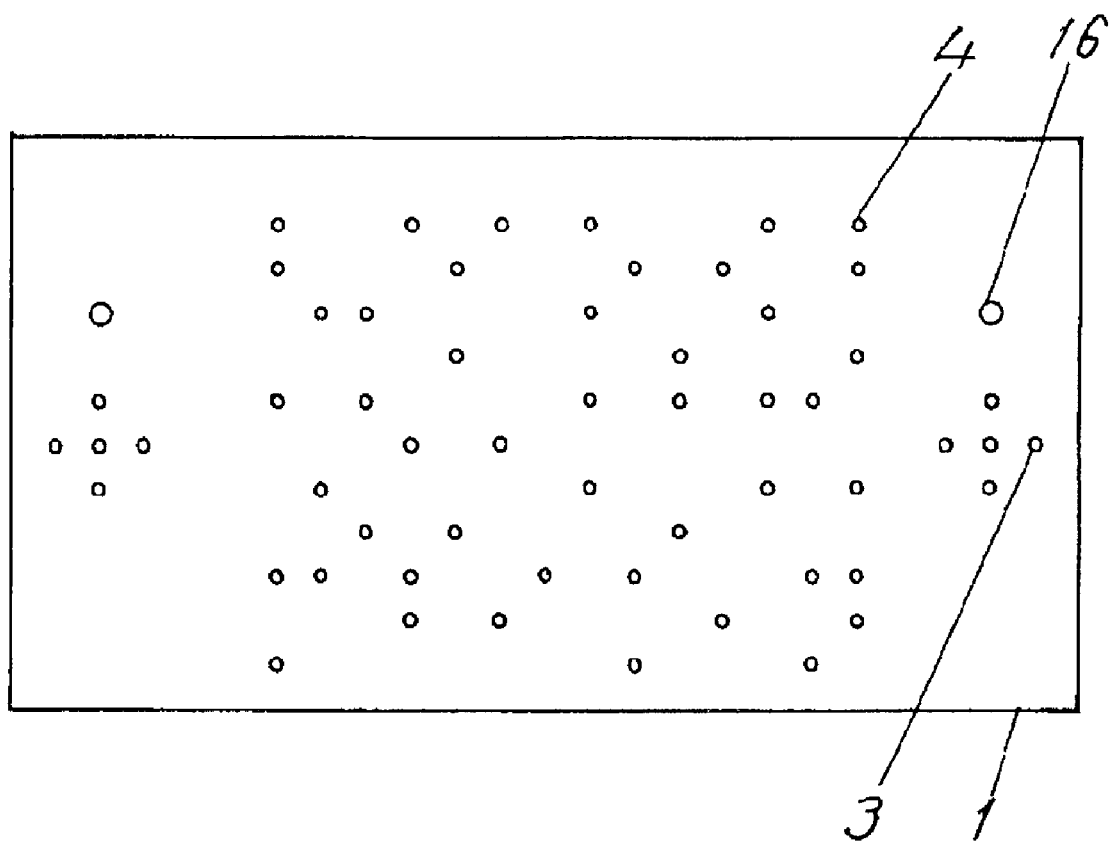
FIG. 6 is a top view showing a drilling position in the fourth preferred embodiment of the present invention.

FIG. 6 is a top view showing the positions of a substrate material 1 in the fourth preferred embodiment of the present invention.

FIG. 6 shows a state of a film-laminated substrate material drilled by a laser beam using the same substrate material as in the second preferred embodiment. Through-holes 4 are drilled to be 150 μm in diameter, and positioning through-holes 3 are similarly drilled to be 150 μm in diameter.

Similar to the second preferred embodiment, the manufacturing method in the present preferred embodiment proceeds as follows. A positioning by X-ray recognition is performed at the position of positioning through-holes 3 in order to drill the positioning guide hole after filling conductive paste into prepreg, peeling off the film, and heat pressing the board material sandwiched with copper foils.

The positioning through-holes 3 consist of five through-holes 3 as shown in FIG. 6. Each of a center of gravity position of the five holes is first measured, and further, the center of gravity of the five positions is calculated to obtain the coordinates in order to form the positioning guide hole.

By this method, as compared with the case of forming one positioning through-hole 3, it is possible to perform the drilling operation while experiencing less influence by the shape of each hole. In the present preferred embodiment, four positioning through-holes 3 are formed at positions shifted 0.8 mm from each other in the up, down, right, and left directions from the positioning through-hole 3 at the center.

A rough recognition through-hole 16, as shown in FIG. 6, is provided to have a diameter of 200 μm which is formed by a plurality of drilling as described in the second preferred embodiment. This rough recognition through-hole is obtained by drilling a 150 μm diameter hole at the drilling target position, and implementing an auxiliary drilling position at positions shifted 25 μm each from the drilling target position. Thus, the rough recognition through-hole 16 of about 200 μm in diameter is formed by drilling five times.

The rough recognition through-hole 16 is used as a guide hole when the substrate material 1 is placed on a stage for X-ray recognition of the positioning through-hole 3. The position of the rough recognition through-hole 16 is first recognized by an low magnification X-ray camera, and positioning of the substrate material 1 on the table is performed with reference to the position.

For the positioning through-hole 3, it is necessary to accurately form the positioning guide hole, and therefore, a large magnification X-ray camera is used for the recognition of the positioning through-hole 3.

Since the visual field of the large magnification X-ray camera is narrow, when the substrate material 1 is placed on the table with reference to an end of the substrate material 1 without using the rough recognition through-hole 16, the positioning through-hole 3 may sometimes fail to be within the visual field of the large magnification X-ray camera.

Accordingly, the rough recognition through-hole 16 is required to be large enough so that it may be recognized by a low magnification X-ray camera having a wide visual field. In the example of this preferred embodiment, the positioning through-hole 3 and the rough recognition through-hole 16 are formed under same conditions of a laser beam drilling machine, and a positional relation between both holes is excellent in reproducibility. Further, the positional relation between the positioning through-hole 3 and the through-hole 4 is extremely high in accuracy, and it is possible to obtain a manufacturing method to obtain a high-density circuit board of high quality in high yield.

In the present preferred embodiment, the large magnification X-ray camera has a visual field of a 3 mm square that is sufficient to accurately recognize the five marks as described above. In addition, the visual field of the low magnification X-ray camera is a 10 mm square and is able to precisely recognize the rough recognition through-hole 16 even when the drilling position by the laser beam includes a few millimeters of variation against the outer shape of substrate material 1.

As a method of drilling using a laser beam, it is possible to employ a drilling machine using a collecting optical system or an image transfer method using a mask. When holes of different diameters are formed, in the case of a conventional collecting optical system, it is necessary to change the beam energy or aperture used for the optical system and, in a case of a conventional image transfer method, it is necessary to replace the masks with holes having different diameters, thereby resulting in longer tact time. Also, the replacing job causes a problem such that it is hard to assure the accuracy of relative positions between holes of different diameters. In the case of the present invention, it is possible to form a number of holes of different diameters by using the same system, and there is no need of replacing a mask or the like.

Also, even in the case of a method of recognizing the conductive paste filled in the rough recognition through-hole directly by a CCD camera or the like, for example, by partially removing the copper foil in the position of the rough recognition through-hole by etching, the present invention is capable of obtaining the intended result because of the reasons as described above.

According to each of the preferred embodiments of the present invention, each of the positioning hole and the through-hole is described as a through-hole, but same effects may be obtained with blind-holes. Also, the method of drilling is not limited to a drill method and a carbon dioxide laser beam method. For example, it is also possible to employ a laser beam for a laser ablation using an excimer laser or the like, and a drilling method using a solid-state laser such as YAG laser or various types of energy beams.

Further, the drilling method based on the present invention is applicable even when the process is performed by using only the same drilling method described above or by using a plurality of drilling methods described above.

Also, in the above description, the through-hole and the positioning hole are filled with conductive paste, but it is also possible to make interstitial connections by plating the through-hole and the positioning hole and to use the plated holes recognized as reference marks.

INDUSTRIAL APPLICABILITY

As described above, in a process of forming at least a through-hole or a blind-hole at one desired position of a substrate, the present invention comprises setting a drilling target position for each hole and a plurality of auxiliary drilling positions at the periphery of the drilling target position, and performing a plurality of drillings at the drilling target position and the plurality of auxiliary drilling positions in order to form a through-hole or blind-hole at the desired position. According to the present invention, it is possible to form a plurality of holes having various kinds of diameters by using one type of machining equipment or a jig under a single machining condition. Also, holes of relatively large size may be formed by using a special machine for fine hole drilling, and it is possible to improve the accuracy of relative positions of holes having different diameters. Thus, the present invention is able to reduce the time and costs required for highly accurate circuit board drilling.

The invention claimed is:

1. A method of manufacturing a circuit board, said method comprising:
    setting a target position at a drilling position of a substrate material;
    setting a plurality of auxiliary drilling positions at a periphery of the target position; and
    performing a plurality of drilling operations at the plurality of auxiliary drilling positions to form one of a through-hole and a blind-hole at the drilling position,
    wherein the drilling operations at the plurality of auxiliary drilling positions are performed using an energy beam,
    wherein the energy beam is applied to the substrate material by one of a collecting optical system and an image transfer method using a mask built in an optical system for image transfer,
    wherein the one of the through-hole and the blind-hole is used as one of a positioning mark and a guide mark,
    wherein two or more of the one of the through-hole and the blind-hole are each used as a positioning mark or a guide mark, and
    wherein one of an average position of coordinates and an area center of a gravity position of the two or more through-holes or blind-holes is used for positioning.

2. A method of manufacturing a circuit board as claimed in claim 1, wherein said performing a plurality of drilling operations further comprises performing a drilling operation at the target position.

3. A method of manufacturing a circuit board as claimed in claim 1, wherein the one of the through-hole and the blind-hole is used as one of the following:
    a part of a connecting device operable to connect an upper surface circuit and a back surface circuit of a double-sided circuit board; and
    a part of an interstitial connecting device for a multi-layered circuit board.

4. A method of manufacturing a circuit board, said method comprising:
    setting a target position at a drilling position of a substrate material;
    setting a plurality of auxiliary drilling positions at a periphery of the target position; and
    performing a plurality of drilling operations at the plurality of auxiliary drilling positions to form one of a through-hole and a blind-hole at the drilling position,
    wherein the drilling operations at the plurality of auxiliary drilling positions are performed using an energy beam,
    wherein the energy beam is applied to the substrate material by one of a collecting optical system and an image transfer method using a mask built in an optical system for image transfer,
    wherein machine readable data stored on a machine readable medium is used by a machine for setting the plurality of auxiliary drilling positions and for drilling at the plurality of auxiliary drilling positions to form one of the through-hole and the blind-hole,
    wherein the machine readable data enables the machine to perform drilling to form at least two of any combination of through-holes and blind-holes having different diameters, and
    wherein the different diameters are formed using a device having a single drilling diameter.

5. A method of manufacturing a circuit board, said method comprising:
    setting a target position at a drilling position of a substrate material;
    setting a plurality of auxiliary drilling positions at a periphery of the target position; and
    performing a plurality of drilling operations at the plurality of auxiliary drilling positions to form one of a through-hole and a blind-hole at the drilling position,
    wherein the drilling operations at the plurality of auxiliary drilling positions are performed using an energy beam,
    wherein the energy beam is applied to the substrate material by one of a collecting optical system and an image transfer method using a mask built in an optical system for image transfer,
    wherein machine readable data stored on a machine readable medium is used by a machine for setting the target position of drilling on the substrate material, for setting the plurality of auxiliary drilling positions at a periphery of the target position, and for performing the drilling operations at the auxiliary drilling positions to form one of the through-hole and the blind-hole at the target position,
    wherein the machine readable data enables the machine to perform drilling to form at least two of any combination of through-holes and blind-holes having different diameters, and
    wherein the different diameters are formed using a device having a single drilling diameter.

6. A method of manufacturing a circuit board as claimed in claim 2, wherein the one of the through-hole and the blind-hole is used as one of a positioning mark and a guide mark.

7. A method of manufacturing a circuit board as claimed in claim 1, wherein each of the positioning marks and the guide marks are provided either for fine positioning or for rough positioning, and wherein the positioning mark or the guide mark for rough positioning is formed by performing a plurality of drilling operations.

8. A method of manufacturing a circuit board as claimed in claim 2, wherein the one of the through-hole and the blind-hole is used as one of the following:
   a part of a connecting device operable to connect an upper surface circuit and a back surface circuit of a double-sided circuit board; and
   a part of an interstitial connecting device for a multi-layered circuit board.

9. A method of manufacturing a circuit board, said method comprising:
   setting a target position at a drilling position of a substrate material;
   setting a plurality of auxiliary drilling positions at a periphery of the target position; and
   performing a plurality of drilling operations at the plurality of auxiliary drilling positions to form one of a through-hole and a blind-hole at the drilling position,
   wherein the drilling operations at the plurality of auxiliary drilling positions are performed using an energy beam,
   wherein the energy beam is applied to the substrate material by one of a collecting optical system and an image transfer method using a mask built in an optical system for image transfer, and
   wherein a distance between each of the plurality of auxiliary drilling positions and the target position is no greater than half of a diameter of a hole formed by one drilling operation.

10. A method of manufacturing a circuit board as claimed in claim 1, wherein said performing the plurality of drilling operations is performed using laser ablation.

11. A method of manufacturing a circuit board as claimed in claim 1, wherein said performing the plurality of drilling operations is performed using one of a carbon dioxide laser beam and an energy beam having a wavelength in an infrared region.

12. A method of manufacturing a circuit board said method comprising:
   setting a target position at a drilling position of a substrate material;
   setting a plurality of auxiliary drilling positions at a periphery of the target position; and
   performing a plurality of drilling operations at the plurality of auxiliary drilling positions to form one of a through-hole and a blind-hole at the drilling position,
   wherein the drilling operations at the plurality of auxiliary drilling positions are performed using an energy beam,
   wherein the energy beam is applied to the substrate material by one of a collecting optical system and an image transfer method using a mask built in an optical system for image transfer, and
   wherein said setting a target position, said setting a plurality of auxiliary drilling positions, and said performing a plurality of drilling operations are repeated to form at least two of any combination of through-holes and blind-holes having different diameters, and wherein the different diameters are formed using a device having a single drilling diameter.

13. Machine readable data stored on a machine readable medium and used by a machine for performing drilling at a target position on a substrate material of a circuit board, said machine readable data comprising:
   machine readable target position data operable to set the target position of drilling on the substrate material;
   machine readable auxiliary drilling position data operable to set a plurality of auxiliary drilling positions at a periphery of the target position;
   wherein said machine readable target position data and said machine readable auxiliary drilling position data is used by the machine to perform drilling operations at the auxiliary drilling positions to form one of a through-hole and a blind-hole at the target position,
   wherein the drilling operations at the auxiliary drilling positions are performed using an energy beam,
   wherein the energy beam is applied to the substrate material by one of a collecting optical system and an image transfer method using a mask built in an optical system for image transfer,
   wherein the one of the through-hole and the blind-hole is used as one of a positioning mark and a guide mark,
   wherein two or more of the one of the through-hole and the blind-hole are each used as a positioning mark or a guide mark, and
   wherein one of an average position of coordinates and an area center of a gravity position of the two or more through-holes or blind-holes is used for positioning.

14. A method of manufacturing a circuit board as claimed in claim 1, wherein the plurality of auxiliary drilling positions are symmetrical with respect to the target position.

15. A method of manufacturing a circuit board as claimed in claim 1, wherein the plurality of auxiliary drilling positions are at vertices of one of an equilateral triangle, a square, and a polygon with the target position as a center of gravity.

16. A method of manufacturing a circuit board, said method comprising:
   setting a target position at a drilling position of a substrate material;
   setting a plurality of auxiliary drilling positions at a periphery of the target position; and
   performing a plurality of drilling operations at the plurality of auxiliary drilling positions to form one of a through-hole and a blind-hole at the drilling position,
   wherein the drilling operations at the plurality of auxiliary drilling positions are performed using an energy beam,
   wherein the energy beam is applied to the substrate material by one of a collecting optical system and an image transfer method using a mask built in an optical system for image transfer, and
   wherein a distance between each of the plurality of auxiliary drilling positions and the target position is no greater than 75 µm.

17. A method of manufacturing a circuit board, said method comprising:
   setting a target position at a drilling position of a substrate material;
   setting a plurality of auxiliary drilling positions at a periphery of the target position; and
   performing a plurality of drilling operations at the plurality of auxiliary drilling positions to form one of a through-hole and a blind-hole at the drilling position,
   wherein the drilling operations at the plurality of auxiliary drilling positions are performed using an energy beam,
   wherein the energy beam is applied to the substrate material by one of a collecting optical system and an image transfer method using a mask built in an optical system for image transfer, and
   wherein a distance between each of the plurality of auxiliary drilling positions and the target position is no greater than a half of a diameter of a hole obtained by performing one drilling operation.

18. A method of manufacturing a circuit board as claimed in claim 1, wherein the one of the through-hole and the blind-hole is detected using X-ray.

19. A method of manufacturing a circuit board, said method comprising:

setting a target position at a drilling position of a substrate material;

setting a plurality of auxiliary drilling positions at a periphery of the target position; and performing a plurality of drilling operations at the plurality of auxiliary drilling positions to form one of a through-hole and a blind-hole at the drilling position, wherein the drilling operations at the plurality of auxiliary drilling positions are performed using an energy beam, wherein the energy beam is applied to the substrate material by one of a collecting optical system and an image transfer method using a mask built in an optical system for image transfer, wherein the one of the through-hole and the blind-hole is used as one of a positioning mark and a guide mark, and wherein the one of the through-hole and the blind-hole is detected by a camera provided with one of an image pickup tube and a solid image pickup element.

20. Machine readable data stored on a machine readable medium and used by a machine for performing drilling at a target position on a substrate material of a circuit board, said machine readable data comprising:

machine readable auxiliary drilling position data operable to set a plurality of auxiliary drilling positions at a periphery of the target position;

wherein said machine readable auxiliary drilling position data is used by the machine to perform drilling at the auxiliary drilling positions to form one of a through-hole and a blind-hole at the target position, wherein said machine readable data comprises data enabling the machine to perform drilling to form at least two of any combination of through-holes and blind-holes having different diameters, and wherein the different diameters are formed using a device having a single drilling diameter.

* * * * *

UNITED STATES PATENT AND TRADEMARK OFFICE
CERTIFICATE OF CORRECTION

PATENT NO. : 7,097,394 B2 Page 1 of 1
APPLICATION NO. : 10/149202
DATED : August 29, 2006
INVENTOR(S) : Toshihiro Nishii et al.

It is certified that error appears in the above-identified patent and that said Letters Patent is hereby corrected as shown below:

Column 11,

Line 42, "a circuit board said" should read --a circuit board, said--.

Signed and Sealed this

Twenty-sixth Day of December, 2006

JON W. DUDAS
*Director of the United States Patent and Trademark Office*